United States Patent [19]

Scobey et al.

[11] Patent Number: 5,656,138
[45] Date of Patent: Aug. 12, 1997

[54] VERY HIGH VACUUM MAGNETRON SPUTTERING METHOD AND APPARATUS FOR PRECISION OPTICAL COATINGS

[75] Inventors: Michael A. Scobey, Aliso Viejo, Calif.; Stanley L. Bryn, Chelmsford, Mass.

[73] Assignee: The Optical Corporation of America, Westford, Mass.

[21] Appl. No.: 791,773

[22] Filed: Nov. 13, 1991

Related U.S. Application Data

[63] Continuation-in-part of Ser. No. 717,047, Jun. 18, 1991, abandoned.

[51] Int. Cl.$^6$ .................................................. C23C 14/34
[52] U.S. Cl. ........................... 204/192.12; 204/192.13; 204/298.04; 204/298.03; 204/298.07
[58] Field of Search ...................... 204/192.12, 192.13, 204/298.04, 298.03, 298.07, 298.27, 298.28

[56] References Cited

U.S. PATENT DOCUMENTS

| | | | |
|---|---|---|---|
| 3,294,669 | 12/1966 | Theuerer | 204/298.07 |
| 3,976,555 | 8/1976 | Von Hartel | 204/298.07 X |
| 4,094,764 | 6/1978 | Boucher et al. | 204/298.07 X |
| 4,140,078 | 2/1979 | Wilmanns | 204/298.03 X |
| 4,311,725 | 1/1982 | Holland | 204/298.03 X |
| 4,392,931 | 7/1983 | Maniv et al. | 204/298.07 X |
| 4,412,906 | 11/1983 | Sato et al. | 204/298.07 |
| 4,420,385 | 12/1983 | Hartsough | 204/298.07 X |
| 4,425,218 | 1/1984 | Robinson | 204/298.07 |
| 4,572,842 | 2/1986 | Dietrich et al. | 204/298.07 X |
| 4,626,336 | 12/1986 | Bloomquist et al. | 204/298.27 X |
| 4,793,908 | 12/1988 | Scott et al. | 204/298.04 X |
| 4,816,133 | 3/1989 | Barnett | 204/298.27 X |
| 4,931,169 | 6/1990 | Scherer et al. | 204/298.11 |
| 4,946,576 | 8/1990 | Dietrich et al. | 204/298.07 X |

OTHER PUBLICATIONS

Vossen et al., "Thin Film Processes", Academic Press, 1978, pp. 150–156.

*Primary Examiner*—Nam Nguyen
*Attorney, Agent, or Firm*—Joseph R. Dwyer

[57] ABSTRACT

A method and apparatus for sputtering coatings on substrates in very high vacuum conditions is shown where the high vacuum is made possible by a supply of inert gas localized at the sputtering source and confined by velocity and by physical constraints in the area of the source and is depleted as the inert gas flows into a larger vacuum chamber. Additional methods to improve testing of substrates being coated and to enhance the sputtering process by use of ion gun directed reactant toward the substrates are disclosed. The method and apparatus are especially effective in allowing large spacing between source and substrates in the sputtering process. The large spacing provides good coating uniformity on large substrates.

23 Claims, 3 Drawing Sheets

VERY HIGH VACUUM MAGNETRON SPUTTERING METHOD AND APPARATUS FOR PRECISION OPTICAL COATINGS

This is a continuation-in-part of application Ser. No. 07/717,047 filed Jun. 18, 1991, abandoned.

FIELD OF INVENTION

This invention covers the coating of optical parts to form filters and for wear and other purposes. It utilizes high vacuum deposition with improvements in the magnetron and the arrangement of source and substrates that provides uniformity of the coatings over large parts.

DEFINITIONS

As used herein, "substrate", "part", "object" and "product" are synonymous and identify the item being coated, "source" is the source of sputtering material. This source is also referred to in the prior art as the "target".

BACKGROUND OF THE INVENTION

Vacuum deposition as a method of creating deposits of a film on a surface is known and has been done for a number of years. The sputtering process, which is one form of deposition, involves the ionization of inert gas molecules which, under the effect of a electric field, then impact on a source material and dislodge particles of the source material. These dislodged particles have high energy levels and travel toward a substrate where they react with other atoms or molecules and are deposited on the substrate. The process is effective and relatively simple but it suffers from a variety of serious problems.

The other form of vacuum deposition is an evaporation process. The layers deposited in this prior art evaporation process were often porous and often absorbed moisture which changed their optical properties.

A solution for the porosity is to sputter the coatings which provides better density of deposit, but as mentioned above, sputtering has several serious drawbacks. The sputtering process requires the presence of an inert gas yet this gas causes thermalization of the sputtered particles due to collisions between the ions and molecules and this in turn lowers the energy levels of the sputtered particles. High energy of deposited particles gives best properties of the coatings so collisions are to be avoided. The possibility of collisions and the resulting loss of energy in the particles in this process requires the substrate and the source to be close together to avoid collisions.

Testing is also difficult when the source and the substrate are close together. At present, complex and tight tolerance coating where a 0.3% center wavelength or optical thickness variation or bandpass variation is not done due to the complexity of maintaining coating uniformity and the need to test as the coating is deposited.

One of the ways the uniformity of the coating is improved that is utilized in evaporative coating is the box coater. In this generally available system, a large square chamber is used with a circle of devices located on the bottom of the chamber. In this circle are two thermal sources and two electron guns in a typical arrangement. The multiple sources and the fact that these sources are located at a considerable distance from the substrates being coated and the fact that the substrates are rotated make the uniformity of the coating usually good. Unfortunately, the distances in a box coater are an insurmountable barrier to prior art sputtering processes since there would be many collisions between the particles sputtered from the surface of the source and the inert gas on the way to the substrate. The presence of inert gas lowers the mean free path between collisions and the many collisions destroy the energetic particles energy and remove a major advantage of the sputtering process. Ideally there should be two or less collisions between the substrate and the sputtering source for the average particle that is being coated on the substrate. In a box coater configuration, ten or more collisions would be normal due to the effect of reactant gas and inert gas.

The biggest problem with using large spacing between the substrate and source in sputtering processes is thermalization. The sputtering process is effected by energized molecules of inert gas impacting a source surface and displacing particles of the source material. This particle then travels from the area of the source toward the deposition substrate where it hits and combines with another reactant on the surface of the substrate and is deposited on the substrate. As the particle travels from the source toward the substrate, it constantly encounters other molecules of the inert gas. The inert gas must be present in sufficient concentration to effectively displace particles from the source but, after that function is complete, the inert gas concentration is destructive to the transfer of the particles to the substrate.

The basic method of reducing the thermalization and scattering is the reduction of the spacing between the substrate and the source to reduce the number of total collisions. The large spacings used in a box coating configuration, or an approach to point source geometry, is thus not possible in sputtering of coatings at present. When the space between the substrate and the source is reduced one new problem is created. The density of the stream of particles is now not uniform in relation to various points on the substrate. If the areas of the substrates are large in relation to the source area, it is to be expected that the layer of deposit depends on the path distance variations from substrate to source, Layer variation will be a function of the impingement or condensation amounts and thus vary in thickness. The suggested cure fop this positional layer thickness problem is to use relatively complex rotation of the substrates.

The closeness of the source and the substrate is the cause of another basic problem. The deposition often involves a reaction of one element from the source and another element that is introduced into the area of the substrate. The source material and a reactive gas (reactant) are the most common combination of materials that are induced to react on the substrate to form the desired final layer composition. The reactant has a drastic effect on the source if any reaction takes place on the source. This poisoning of the source has the effect of a roughly tenfold diminution of the number of particles emitted from the surface of the source.

There are several ways to decrease the poisoning of the source. One popular method is to maintain a higher partial pressure of the inert gas in the area of the source and a higher partial pressure of the reactant in the substrate area. This is difficult to do. The close spacing between source and substrate provides opportunity for increased poisoning of the source.

There are several other complex solutions that involve rotation of the substrates between physically separated zones where either reactant or source particles and inert gas predominate. An ideal system would keep the reactant and the inert gas separate and have little gas in the chamber. Since the gas must be present in at least a stoichiometric amount and since it can easily travel in the vacuum chamber, a goal of very low molecular density of gas is not easy to accomplish.

There is no good solution for the separation of reactant and source. In addition, the need for specific densities of molecules at the source and in the reaction area make very low vacuum levels impractical.

An ideal system would have practically no possibility of the reactant reaching the source to eliminate the poisoning of the source, would have very large spaces between the substrate and the source so the geometrical variation in total path is minimized, and would operate at vacuum levels that with the present technology would not allow enough impacts on the source to provide reasonable transfer of the source materials.

Another problem with prior art sputtering processes is the need to have the source and the substrate close together to reduce collision between the sputtered particles, inert gas molecules and other particles which cause energy reduction in the sputtered particles. The ways to reduce the collisions are reduction in total path and reduction in the total density of particles other than source derived particles. Path reduction requires the source be as close as possible to the substrate. Density reduction requires higher vacuum levels.

When the total path is reduced the uniformity of the coating is much more affected by geometry of the parts being coated and the source. The ideal for uniform coatings is to have the source as far away as practical since distance reduces the effect of geometry.

The use of distance as a way to reduce the geometry effects is not generally acceptable since greater distances give longer paths and more collisions which reduce the energy of the sputtered particles. Thus, there is a need for a method and apparatus that can allow a source located at a distance from the substrate and that still allows the sputtered particles to retain their energy level.

The reduction in the path length flies in the face of the need for a longer path to reduce problems in geometry. The density of the gas in the vacuum chamber is tied to two needs. One need is for enough inert gas at the source to enable the sputtering process. Another need is for enough reactive gas at the substrate to react the sputtered particles to the desired coating. The density needed for both the sputtering and the reaction provide enough molecules in the vacuum chamber to create a short mean free path between collisions for the sputtered molecules. As a result of collisions, gas is heated in the chamber and the sputtered particles are depleted of their energy rapidly due to momentum exchange. The source and the substrate must be close to each other to reduce this loss of energy. The normal distance between parts and source is thus forced into the 2 to 5 inch range for most uses.

Thus, there is a need for a method and apparatus that allows a reduced density of gas in the vacuum chamber and thus allows greater distance between the source and the substrate.

There have been attempts at reducing the reactive gas density by segregation of the reactant gas and the inert gas in chambers. One interesting method of doing this is shown in U.S. Pat. No. 4,851,095, supra, which uses a rotary drum to shuttle substrates between high reactant concentration zones and between the sputtering zone. This process creates a needless complexity and will not handle large substrates.

Thus, there is a need for a simple process that will allow a large spacing between the substrate and the source and still permit sputtered particles to reach the substrate with high energy levels. There is also a need for thickness monitoring on real time basis of uniform layers and an ability to coat large and non uniform shaped parts.

There is one specific technology that needs a large spacing between the source and the substrate. In rain erosion coatings of infrared windows and domes, the parts that need coating are frequently large and awkward curved surfaces, such as nose cones, and outer surfaces of aircraft. In these applications, the need is acute for a method to coat the large surfaces with a water and impact resistant layer that holds up under impacts of rain and has good infrared transparency. Here the shape and size make a close spacing between the source and the substrate very difficult. As a result of size and shape considerations, completely different techniques, such as use of microwave degradation of gas and pyrolysis methods, are often used to coat infrared domes.

Thus, there is also a need to be able to coat large non-flat surfaces that has not been met with magnetron sputtering methods. This can be done only when larger spacing is possible between sources and substrates in sputtering.

Two basic methods are used when a coating of a compound is desired.

In the simpler method, the compound is excited to displace molecules and the displaced molecules of the compound are then deposited on the objects. The excitation can be by gas molecules where an inert gas is excited and which then impinges on the source, by thermal methods or by several other methods.

In another method, the object of excitation is a metal as a precursor to the desired coating compound, and the actual reaction is a surface reaction between the excited and displaced precursor material and a reactant gas that is introduced into the vacuum chamber.

The second method of deposition is of interest because it uses sputtering processes. The introduction of reactant gas into a vacuum chamber created major problems. The gas is not restrained within the chamber so it can react on the surface of the source precursor material as well as on the surface of the coated object. Even a slight surface reaction on the source precursor material grossly slows the rate of reaction by blocking surface emission of the precursor.

There have been several methods to stop the poisoning of the precursor material most of which involve rotating the objects to be coated between zones, one where the precursor was deposited on the surface and the next with the reactive gas.

A typical method for optical coating as mentioned above has been the evaporation of a compound but the evaporated coatings when formed are rarely the dense and perfect coatings expected. There can be variations in the source material or geometry or flux around the source material which gives directionality to the evaporated molecules emitted from the source. The material can deposit in a porous form that is often 85% or less of the theoretical bulk density of the coating compound. The coatings are seemingly formed of columns of molecules and spaces can exist between the columns according to one theory. The surface formed with the pores attracts water vapor which can have a major effect on performance of the coating. There is a need to form a coating that is dense and relatively pore free.

SUMMARY OF THE INVENTION

This invention solves many of the needs for optical coatings. It is also relatively simple and produces a dense coating that is not affected by water vapors.

Simply stated, the evaporation process makes precision optical coatings with oxides which are porous whereas the sputtering process makes non-porous oxide coatings which are dense. This invention takes the sputtering technology and converts it over to the evaporation geometry to make a dense fully reactive coating at high deposition rate.

The present invention allows the high rates of sputtered coatings and the high energy of the sputtered particles to be used in a system that greatly reduces the possibility of poisoning of the source due to the low reactant gas pressure, high power and small magnetron size.

The method of this invention and the apparatus in which the method is practiced comprises a large vacuum chamber in which a magnetron assembly comprising a water cooled magnetron, a source of sputtering material under the influence of the magnetron with an inert gas impinging upon the source to effectively form the sputtered material. This inept gas is exhausted as rapidly as possible after the sputtering process to reduce any loss of energy in the sputtered material traveling to the substrate to be coated. This inert gas in one embodiment may be contained in a chamber before the gas is exhausted. In another embodiment, the inert gas is directed onto the source by a gas jet. A planetary holder with substrates is spaced from the source and is provided with a rotatable test coupon for thickness monitoring of the coating of the substrates. The substrates are preferably subjected to a reactant gas to improve the deposition process.

In addition to the above Summary, additional explanations of the advantages and uses of the apparatus and method are discussed hereinafter.

The directed and energetic ion source for reactants improves reactions, adds to clarity of the reacted product, and reduces the possibility of poisoning the source.

The method also allows a relatively large spacing between the source and the object being coated allowing use of the method on large objects. This large spacing is possible due to the very high vacuum levels that are attainable in the vacuum chamber without decreasing the sputtering or the reactions needed for the coating process. The invention allows better testing of layers being deposited due to the expanded spacing allowable between the source and the substrate. This improved testing allows easy replacement of test coupons and provides a true real time test of deposition.

The invention is especially useful for coating for rain erosion resistance since the large and odd shapes involved in many of these objects can be coated with the large space between source and substrate made possible with the low molecular density possible in the vacuum chamber with the teachings of this invention.

The invention utilizes a method to excite the surface of a precursor compound which is typically a conductive source. This is a low pressure magnetron system that will function in a very high vacuum environment with vacuum levels on the order of 10 to 100 times that previously effective while coating objects. The low pressures involved reduce energy loss by thermalization of sputtered particles. The process utilizes magnetron sputtering with unusually strong magnetic fields around the source. The reaction between the reactant and the precursor occurs at the surface of the substrate but it can also occur at the source where the sputtering is occurring. It is important to separate the reaction areas and to reduce source reactions. Ideally only inert gas should be near the source and there should be a perfect vacuum separating the source from the reaction surface where the deposit is happening. This is difficult since there must be a minimum level of inert gas to make sputtering work. In sputtering, the inert gas is excited to impinge on the surface of the source which acts like a cathode and effect the sputtering by displacement of surface particles from that source. There must be a minimum level of inert gas concentration to create a sputtering effect. The new magnetron assembly of this invention with unusually high magnetic field and a gas containment means allows the concentration of gas molecules to be reduced to a pressure of $2 \times 10 \exp-4$ torr or less which is at least one quarter of previous minimum levels, This lower pressure requirement would have some effect on the process and the effect seems very beneficial.

This invention provides a method and devices that allow lower pressure sputtering. The invention utilizes the new magnetron design in one preferred embodiment. It also provides a supply of inert gas at the surface of the source and exhausts this introduced gas as rapidly as possible. The major effect of this source directed introduction of the inert gas is a creation of higher pressure zones near the surface of the source. The source is the donor of the particles sputtered from the surface in the sputtering process. The source is a cathode in the sputtering process. The localized pressure at the source (cathode) drops rapidly as the distance from the source is increased. The provision of a source inert gas flow supply at the source along with a variable length retaining area provides a pressure gradient between the source gas supply and the chamber is essential. The flow of gas into the chamber at the source and its lessening density (pressure) as it flows outward into the chamber is critical to this process. The pressure gradient is enabled by very high volume vacuum pumps that continually exhaust the escaping inert gas as well as the excess reactant molecules. With such an arrangement, the surface near the source has the density of inert gas that is needed to enable effective sputtering and yet there is little of the inert gas in the chamber to thermalize or otherwise interfere with the deposition of the coating. If one considers that the area of the substrates may be 100 or more times the area of the source, one can get a feeling of the concentration factor possible near the small source.

In some applications an alternate method of supply of gas to the cathode is possible. In this method, a jet of gas directed at the cathode area alone will provide part of the advantage of this method since the gas hits the surface and then rapidly dissipates into the chamber. While workable, this method is inferior to the compartmented chamber containing the source or cathode.

Normally to reactively deposit in a very high vacuum, the vacuum level would preclude a sufficient amount of a reactant to transform the source precursor into the desired coating compound. This problem has been solved by directing the reactant to the surface of the object to be coated. The directional method is the use of an ion beam which allows a focused directional stream of reactive molecules or atoms to impinge on the surface to be coated and to react on the surface. This method is a major improvement over the prior art in three ways. First, the reactant is delivered directionally to the surface where the coating is applied and reacts there. Secondly, the reactant and the precursor are delivered with high energy levels which aids in the formation of a uniquely dense surface film. Finally, unlike other methods where the gas is generally introduced into a vacuum chamber or partial pressures of reactant and nonreactants are used for containment of the reactant, this directed stream provides the reactive elements only in the vicinity of the object being coated. By providing an excess or an adjusted ratio of reactant and precursor compound, there is little excess of the reactant ionized materials than can drift to and poison the precursor compound supply. The little free reactant is also rapidly swept from the vacuum chamber.

The very high vacuum used in this process is at a level not practical with the prior art. A high density of the inert gas was formerly needed throughout the vacuum chamber to insure adequate molecules near the surface of the source. In the new method, the volume removal from the chamber is important so the pumps used are all of a high volume design compared to those formerly used. The pumps are also not only high volume but they are optimized for pumping at a lower pressure level so that they are effective in this new vacuum regime. In the new method, the effect of rapid removal of the reactant, which otherwise would slow deposition rates due to the presence of less reactant, also reduces the possibility of contamination and poisoning of the source. The source poisoning is a problem that normally vastly slows sputtering effectiveness so the net tradeoff is positive as regards to output in most cases.

The film that results from the reaction that occurs at this high vacuum level is significantly different that formed at lower levels. There is less scattering and less diminution in energy levels of the sputtered particles. The density of the coatings is at the theoretical bulk film density for the compounds indicating that there is no porosity in the coatings. This lack of porosity also eliminates the water vapor problem of evaporated oxide coatings. The relatively high energy of the particles and/or the precursor particles is thought to disrupt the columnar structure assumed to be a usual coating morphology. The columns may be shifted or destroyed by the higher energies possible in this low pressure process. The lower pressure also probably has an effect on the formation of the surface films and their porosity. The method is too new at this time to permit definition of the contributions of each of the elements of the process or full determination as to how the elements would work separately in modifications of other processes for delivery of the reactant to the substrate area.

It is expected that the process used to supply inert gas to the source area would also work to deliver reactant to the substrate area. This variation in gas density at the substrate and the gradient of pressure as the distance from the substrate is increased is expected to also provide a better coating at high rates. It will be slower and it is less advantageous than the energized directed ions of reactant impinging on the substrate.

It is noteworthy that a variety of methods can be used to deliver the reactant to the substrate. In most of the alternate methods of delivery, the improved vacuum (lower pressure) will assist in the delivery and scattering will be diminished. A key concept that further makes this method effective is the ionizing or adding to the reactivity of the ions of the reactant and directing them toward the substrate area. The excitation of reactive gas or enhancement of reactivity can be done in a number of ways. Such an enhanced reactivity has a longer free path in the higher vacuum and it adds to the effectiveness of the method.

This method and the apparatus to enable this method allow unique combinations of materials. Basically, any conductive material can be sputtered. The sputtering along with the highly directed ion flow works to easily produce oxide and nitride coatings. It also has good prospects to allow coatings of other materials using mixtures and very highly reactive materials. The process also works with materials, such as Ce and In/Sn mixtures and GaAs. It is expected that the high vacuum levels will make practical coatings that are now infeasible and thus expand the range of properties of coated objects.

The coating is usually considered in light of the needs for optical filters and similar objects. This method is expected to allow application of sputtered and surface reacted coatings on substrates that include wear surfaces, electrical insulators and other areas not now considered as markets for sputtered or surface reacted coatings.

DETAILED DESCRIPTION OF THE INVENTION

Figure 1:
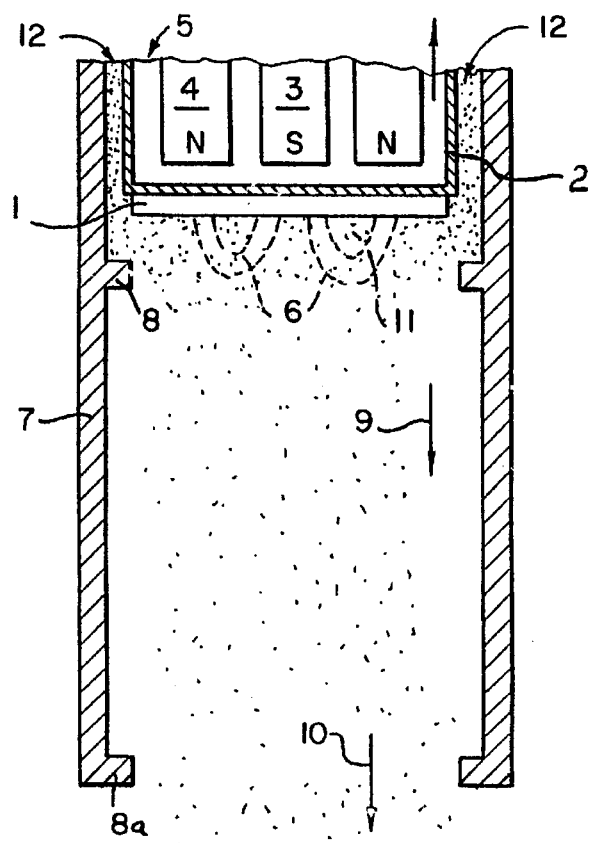
FIG. 1 is a schematic illustration of the first embodiment of the source and shows the flow of coolant and inert gas within a confinement.

FIG. 1 shows a source 1 as a plate of material held to a water cooled metal base 2 containing the magnetic coils 3,4 which are cooled by pumped flow of coolant 5. The magnetic fields 6 formed by the magnets are supplied with an inert gas entering a confinement delivery chamber formed by containment sleeve 7 which has a flow control lip 8 that will direct the gas flow over the surface of the source and provides a ground shield and the containment sleeve 7 enables the gradient 9 to form. The gradient 9 varies from relatively dense gas molecules 11 at the source surface in a direction of lowering density as the flow exits the containment sleeve in a direction as shown by arrow 10. Lip 8a is a confinement lip which acts as a high pressure enclosure.

Figure 2:
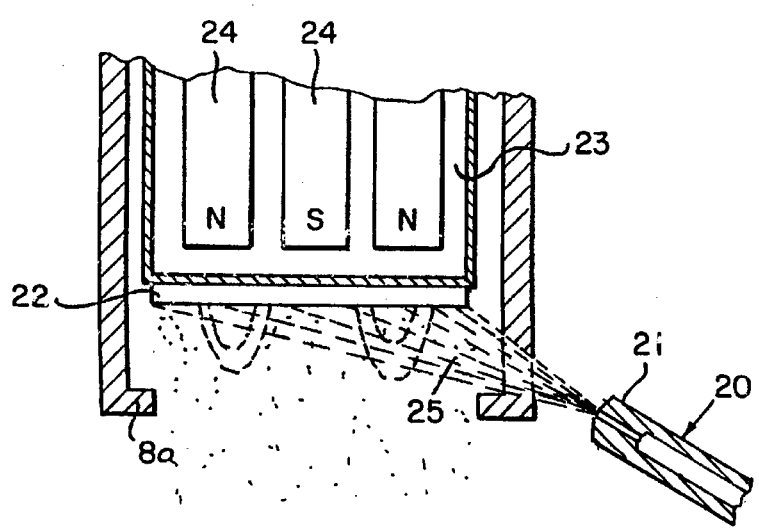
FIG. 2 is a schematic illustration of another embodiment for applying inert gas to the surface of the source.

In FIG. 2, the invention is shown in a version which allows a jet of inert gas 20 which is directed by nozzle 21 to impinge upon the source of the sputtering 22. The source is mounted on a cooling chamber 23 which encloses high power permanent magnets 24 direct the inert gas molecules onto the source surface. The gas molecules 25 are relatively concentrated at the source surface but they dissipate as the distance from the source increases.

Figure 3:
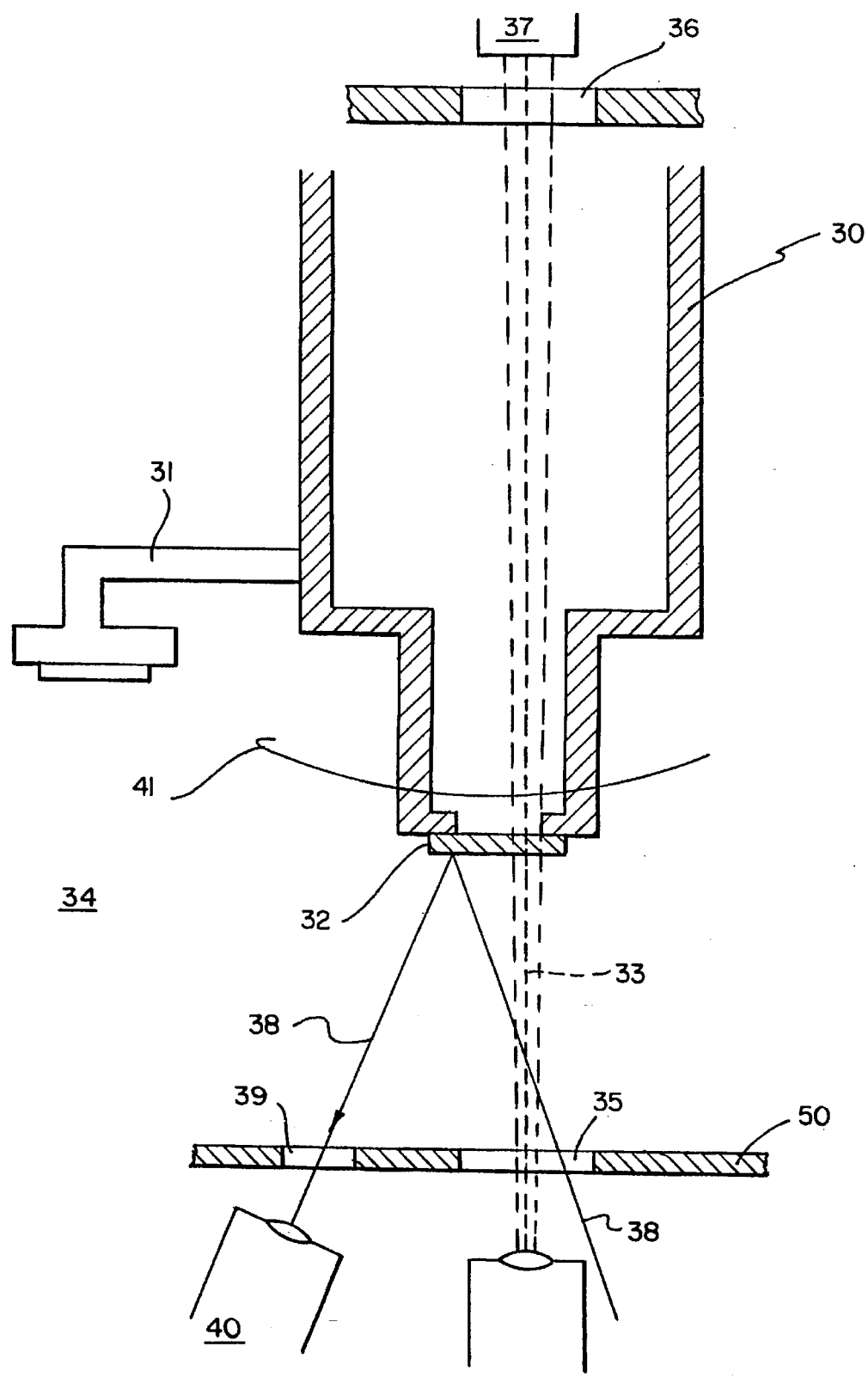
FIG. 3 illustrates a test coupon system within the vacuum chamber.

In FIG. 3, the test coupon system is shown with the key features as the hollow shaft 30 of the planetary sample holder 31 which has a test coupon 32 mounted on the end and which has beams of energy 33 directed from a source external to the vacuum chamber 34 through a window arrangement 35 and which then passes through the test coupon and then through a second window 36 to a detector 37 which is located outside of the vacuum chamber. A second energy beam 38 is also shown and this beam is directed to reflect from the surface of the test coupon and through a third window 39 to a reflectance detecting device 40. The rotation of the hollow shaft holding the test coupon is shown by arrow 41.

The most preferred embodiment of this invention is illustrated by description of the coating equipment and process modified to encompass the invention.

Figure 4:
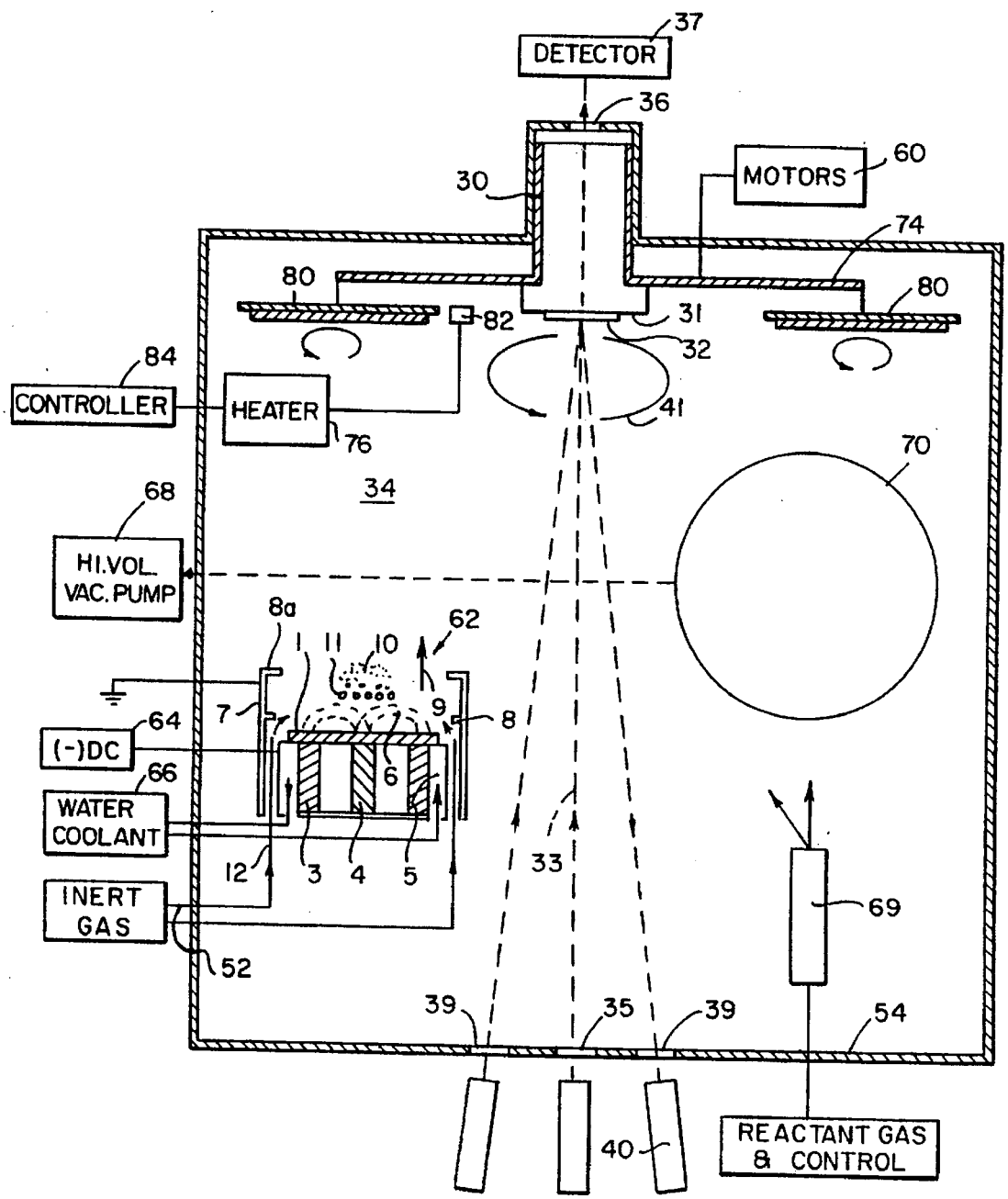
FIG. 4 shows the first embodiment of the source, coolant and inert gas within a vacuum chamber and the planetary substrate holder and other apparatus for performing the method of this invention.

Referring now to FIG. 4, the heart of the process is a large vacuum chamber 50. This chamber 50 is a 3 foot welded cube constructed of 1 inch thick steel to withstand the force of the atmosphere. The weldment has several ports that are sealed and which may allow passage of gas, allow pumping of the chamber, permit testing, or provide access to the chamber. While the preferred embodiment is of in house construction and not a commercially manufactured unit, there are a number of commercial producers of similar vacuum chambers.

In FIG. 4, the elements of the vacuum chamber 50 are identified. The basic elements are the chamber 50, the inputs to the chamber which are the inert gas input 52, the reactive gas input 54, access for testing (not shown), power 60 for manipulation of parts and part holders, magnetron assembly 62 (magnets 3 and 4 in FIG. 1) and magnetron power 64 and cooling 66 (5 in FIG. 1), the vacuum pumping devices 68 and the ion gun 69. These elements will be discussed individually.

There is a large port 70 supplied to handle the vacuum pump. In this case a 16 inch port 70 is supplied to accomodate a cyrogenic pump. These pumps are well known in the industry and the specific pump is a On Board Model 10 manufactured by CTI, a firm in Waltham, Mass.. The 10 inch pump can be a cryopump as in this example but a diffusion pump is also workable. When a diffusion pump is operated there is no need for a cold trap and a Meisner trap is installed in the bottom of the chamber. A problem with the cyrogenic pump is that there is a leveling of the output at a volume/vacuum point due to overwhelming the cryopump cooling capacity. With this invention, the pump should be sized such that the leveling point has not been reached since there will be a constant flow of added gas sweeping out of the chamber and continued high vacuum levels are needed. The selection of pumps such that the pumping action is in the most effective area of the pump curve and where the throughput is increasing with pressure drop is suggested. The selection process is one known in the industry with the usual selection for a chamber as described in this embodiment being a 10 inch cryogenic pump as opposed to the 16 inch pump that is needed to optimize this process. The vacuum size constraint is partially due to vacuum levels of 4 to 12 higher than those normally used in the industry are needed (lower molecular densities). Unlike the earlier prior art sputtering systems, the increased vacuum does not slow the process as discussed below. The use of the large volume vacuum pumps contrasts with the need to baffle the vacuum pump to ensure the proper inert gas levels of such gas, such as argon, in the chamber that is common in present practice in the industry.

There is a test or monitor function in the vacuum chamber and transparent ports 38 and 39 to support the test function. The normal method in the industry is to either use a stationary clip changer with a test coupon and to measure the reflectance of this test coupon or to make a test plate and to measure transmission through a spinning plate of parts being made. The problems with the two common methods are the thickness variations from side to side of the test coupon that can happen with a stationary test coupon and the difficulty in measuring the complex designs of non-quarterwave optical thicknesses. The complexity of measuring a production part as it is rotated for uniformity of coating in a production holder is also a problem. The problems are especially hard to solve with a rotating plate when a complex design is needed which has many different layers and thicknesses. These complex parts require the frequent changing of the test coupon, sometimes between each layer. The frequent change is needed since the layers are additive and one layer may partially block a portion of the test signal or interfere with the test signal. The lack of rotation may deceive the producer as to the actual thickness on the production parts while the complexity of the second part with multiple layers may distort actual values. With a rotary plate change of the parts is very difficult but the deposited layers are uniform while a stationary part holder is easy to change but the layers are not uniform.

In this invention, a new method and apparatus for monitoring the deposition has been developed that combines the benefits of the two common methods. The monitor test coupon 32 is spinning but is located apart from the production part holder disc 72 at or near to the centerline of rotation of the rotary table 74. The location near the centerline is made possible by the unique nature of deposition of the invention which allows a greater spacing between the sputtering source and the parts holders. In the improved test method and apparatus, the rotation of the test coupons 32 is insured by use of a common axis and shaft 30 for the rotation. This insures that a uniform thickness exists across the test coupon 32 and that the test coupon 32 will be representative of the production lot. The location of the test coupon 32 makes the testing easy. The testing uses a chopped beam 33 and 38 directed through ports 35 and 39 in the vacuum chamber 50 to give an actual indication of the deposit transmission at various preselected wavelengths. This method and apparatus, using transmission and an actual test coupon 32, provides a vastly better test than the reflectance or the intermittent signal from the actual parts rotating past a test location. The location and the free space available with this improved method and apparatus also allows the easy changing of test coupons 32 so it is simple and practical to have a new test coupon 32 for each of the many layers or groups of layers that may make up a complex coating or filter element. The ease of changing the test coupons 32 also allows the testing of any type of deposit as an individual layer.

The sputtering is done with a magnetron source such as magnetron assembly 62. In a standard unit, the source is held to a magnetic pole which created a field 6 of around 100 to 300 gauss. The magnetic field 6 is established by rare earth permanent magnets as is known in the industry. The magnetic field 6, source 1 and the magnets 3 and 4 are water cooled by circulating fluid 5 on the inside of the magnet/source and the entire magnetron system 62 is surrounded by a ground shield formed by grounded containment sleeve 7.

The system utilizes the argon in the vacuum chamber 50 to become excited and impinge on the surface of the source 1 displacing particles of the source material. There is a needed concentration of gas molecules or atoms in the vicinity of the source to effect a reasonable rate of displacement from the surface of the source 1. The concentration needed to allow good rate of transfer also causes problems since the high level of molecules or atoms means a relatively short mean free path between collisions. Layers formed from thermalized or non energetic deposited materials are noted for porosity. In the prior art, the cure for the short mean free path of the molecules and atoms is to place the source 1 as close as possible to the substrate and thus reduce the total distance that must be traveled between the source 1 and the substrate. This close spacing causes difficulty in finding a method to monitor the buildup of the deposit and increase the possibility of non uniformity since complex rotation methods are needed to handle the non-uniformity of deposit caused by differing paths from the source to the substrate.

In this invention, the source 1 is attached to the magnets 3 and 4 and very high magnetic fields are used. These fields are in excess of 300 to 500 gauss. The higher fields alone could marginally improve the effectiveness of the apparatus by more effective use of the argon but improvement would be small. In this invention, the argon in the chamber is however partially eliminated by delivery of the argon to the confinement delivery chamber 7 which forms a division of the overall chamber 50. This chamber 7 extends toward the chamber 50 from the magnets and source material. The preferred configuration of this chamber 7 is shown in FIG. 1. This chamber is an extension of the ground shield and contains the argon in the area of the magnetic fields and the source 1 which is a 2 or 3 inch diameter annulus. The constant addition of the argon at the surface of the magnetron also provides a density gradient where the highest concentration of argon molecules is near the surface of the magnetron and which decreases in molecular density as the distance from the magnetron increases. As a result of very high pumping rates and the density gradient, the argon levels in the chamber are 1/5th to 1/20th of the levels previously needed to enable the magnetron sputtering at a given material transfer rate. The lower gas levels in the chamber 50 allows a drastic increase in the mean free path of the particles. There are two possible results of the longer mean free path of the particles. The spacing can be increased between the source and the substrate and partly due to the increased space and partly due to the higher vacuum in the chamber, heat generation is lowered. Reduced scattering or collisions of the sputtered particles aids deposition of dense layers of materials on the substrates. In this preferred version, the source is placed at 16 inches from the plane of rotation of the substrates and 11.5 inches from the axis of rotation as compared to a normal 5 to 6 inches. The chamber molecular density which enables this spacing can easily be at levels 1/50th of normal levels in conventional sputtering methods with this process.

Heaters 76 (one shown in FIG. 4) are provided in the process chamber for control purposes. In this version, quartz radiant heaters 76 are mounted in the chamber 50 with the radiant heat directed toward the product holder disc 80. The heaters 76 are used to compensate for the heat buildup resulting from the ion gun 69 and the magnetron output. As the process starts, the temperature of the product holder disc 80 is set at 100 degrees C. by control of the radiant heaters 76. The radiant heat onto the product holder discs is reduced as the other heat sources add to the disc heat levels to keep the disc close to the initial 100 degree temperature. The location of the heaters is above and below the disc, one heater 76 shown below the disc in FIG. 4. Control in this case is by the use of a thermocouple detector 82 providing input to a scr based controller 84. The thermocouple 82 is ballasted to simulate the mass of a product and located off the holder and is fixed in location to eliminate the problem of rotary contacts that would be needed to attach it to the rotating product holder disc 74.

Within the vacuum chamber 50 is the rotatable table 74 that consists of several product holder discs 80. The discs 80 are on the common central shaft 30 which is rotated by motors 60 outside the chamber. There is a coupling mechanism that permits the transmission of the rotary motion through the chamber wall without sacrifice of the vacuum. Each disc 80 is further rotatable about its own center by gear drives as the several discs 80 rotate around the center shaft 30. This type 316 stainless steel table 74 thus trace a circle around the vacuum chamber 50 while each separate smaller product holding disc 80 traces a further circle around its own center providing a double rotary (planetary) motion. In this unit, four nine inch diameter planets (discs 80) are used as the holders and the transmission monitor is by the spinning test coupon changer 31 with a test coupon 32. There are a variety of other rotating modes, this method is simple and effective.

The ion gun 69 is a low energy gun such as made by Commonwealth of Alexandria, Va.. This unit is their Mark 2 gun although any of a variety of well known ion sources would be equally effective. The gun operates at 6 amps anode current provides an ion density of 2 to 10 milliamps/cubic cm with the anode at 150 volts. It is located 20 inches from the plane of the rotary product holders aimed at the center of rotation of the holders and is 10 inches from the axis of rotation. The reactant gas is volumetrically controlled as it flows into the gun where the magnetic field and the voltage change through this magnetic field ionizes the gas and accelerates the ions into the vacuum chamber through a entry port. The process can run without the ion gun with the use of just reactive non ionized gas but the clarity that is exceptional in the low vacuum sputtering method disclosed is not nearly as good. The sputtering deposition rate also drops when the ions are not present due to lowered reactivity. The ion gun in this invention surprisingly has no detectable effect on the extreme density provided with this invention of very low pressure sputtering and deposition methods. The low density provided is at a level where the addition of the ion assist seems to not have detectable effects in contrast to the claims usually made for ion assisted deposition.

The process works by the displacement of particles from the source. This displacement is caused by the energization of the inert argon molecules which impact on the surface of the source and displace particles of the source material. The displaced particles flow through the vacuum chamber. At the same time a stream of reactive gas, ideally ionized, is directed to the substrate area where a reaction occurs between the source material and the gas on the surface of the substrate.

The process is effective for a number of different materials. Typical operating conditions for the described 36 inch system are as follows.

| Material | power (cathode) | ion beam anode | argon flow | reactant flow | deposit rate |
| --- | --- | --- | --- | --- | --- |
| Ta2O5 | 1000 w | 5–6 a | 35 scc/m | 24 scc/m | 2.5 A/s |
| Al2/o3 | 1000 w | 5–6 a | 35 scc/m | 20 scc/m | 2.4 A/s |
| TiO2 | 1100 w | 5–6 a | 40 scc/m | 22 scc/m | 2.2 A/s |
| ZrN | 400 w | 5–6 a | 35 scc/m | 20 scc/m | 1.0 A/s |
| ZrO2 | 1000 w | 5–6 a | 40 scc/m | 22 scc/m | 2.0 A/s |
| SiO2 | 900 w | 5–6 a | 35 scc/m | 18 scc/m | 1.8 A/s |

Typical deposition chamber pressure 7×10exp–4.

In a second preferred embodiment, a much larger chamber was used and this chamber which has a 42 inch square base and a height of 25 inches again has a double rotary motion product holder with five 17 inch diameter planets each offset from the axis of rotation and which rotate around a common shaft.

In this larger unit, the source is located 35 inches from the plane of the rotary holder and 28 inches from the axis of the rotation of the holder. The ion gun is again aimed on axis and is located 40 inches from the product holder.

The larger chamber requires a larger pump, in this case, a 20 inch difusion pump with no cold trap and an additional 10 inch cryopump that operates at the same time to further increase the system pumping capacity. With the larger unit a six inch diameter cathode size source is used.

With this large unit the operating conditions for various sources are as follows:

| Material | power (cathode) | ion beam anode | argon flow | reactant flow | rate |
| --- | --- | --- | --- | --- | --- |
| Al2/o3 | 5000 w | 10 a | 60 scc/m | 30 scc/m | 3.0 A/s |
| TiO2 | 8000 w | 10 a | 70 scc/m | 40 scc/m | 4.5 A/s |
| AlN | 4000 w | 10 a | 60 scc/m | 30 scc/m | 2.5 A/s |
| SiO2 | 5000 w | 10 a | 60 scc/m | 30 scc/m | 3.0 A/s |

Typical deposition chamber pressure 2×10esp–4

As will be apparent from the foregoing, the embodiment of FIG. 2 may be used in the chamber as shown in FIG. 4 and the containment sleeve 7 may be of any desirable length from 0 to 5 inches depending on the needs of the system and, in summary, the box geometry typically used in an evaporation system, although not effective in a prior art sputtering system, is now usable in a sputtering system as taught by this invention.

We claim:

1. A method of depositing a thin film coating of sputtered particles on substrate means at a rate greater than 1.0 A/s using magnetron means wherein the particles have long throw distances, a long mean free path, and are subjected to exceeding low pressure comprising the steps of:

providing a vacuum chamber having magnetron means and having a source for sputtered particles cooperatively associated therewith, providing means for positioning a substrate in said chamber substantially spaced from said source, directing an inert gas of high molecular density so that said inert gas impinges on the magnetron-energized source to sputter particles for coating the substrate, providing a port of large size in said chamber, connecting the port to a high volume, high vacuum pump, rapidly withdrawing and thereby rapidly depleting said inert gas from the vacuum chamber as soon as possible after the sputtering process by said high volume high vacuum pump so that the molecular density of the inert gas is low in said vacuum chamber and at the substrate to reduce any loss of energy in said sputtered particles as they travel from the source to the substrate substantially spaced therefrom, and, maintaining the vacuum in said vacuum chamber at a level of $7 \times 10^{-4}$ Torr or lower, whereby the exceeding low pressure permits the said long throw distance without excessive gas interaction with the sputtered particles thereby to coat a substrate.

2. The method as claimed in claim 1 including the further step of creating a space between the source and the substrate means of at least eight inches.

3. The method as claimed in claim 1 further including the step of directing ionized reactant gas onto said substrate means to facilitate the deposition of the sputtered particles on said substrate means.

4. The method as claimed in claim 3 including the further step of rotating said substrate means with respect to said chamber.

5. The method as claimed in claim 4 including the further step of providing a plurality of substrates greater than 6 inches in diameter as said substrate means and rotating each substrate about its own axis.

6. The method as claimed in claim 5 further including the step of providing a test coupon centrally of each said rotating substrate means to test the coating as it is being deposited and rotating said test coupon with said substrate means.

7. The method as claimed in claim 6 wherein said coating comprises layers of different sputtered particles on said substrate means and changing said test coupons with every layer of sputtered particles on said substrate means.

8. The method as claimed in claim 1 wherein said source comprises a compound to provide compound sputtered particles.

9. The method as claimed in claim 8 wherein said source is a conductive material to deposit a compound coating on said substrate means.

10. The method of claim 1 wherein said maintained vacuum level is $2 \times 10^{-4}$ Torr or lower.

11. The method of claim 1 wherein the step of providing means for positioning a substrate in the chamber includes providing the means at a distance of at least fifteen inches from the source.

12. An apparatus for magnetron sputtering to obtain a coating on a substrate that includes substrates greater than 6 inches in diameter and at a coating rate greater than 1.0 A/s comprising, means defining a vacuum chamber and having a magnetron cooperatively associated therewith, a source in said chamber for the formation of sputtered particles under the influence of said magnetron and at a high negative voltage level, means creating a volume of inert gas in said chamber including a high density of molecules adjacent said source, means for rapidly exhausting said molecules from said chamber as soon as possible after formation of said sputtered particles to reduce interference between the inert gas molecules and the sputtered particles and thereby to provide a very low density volume of said inert gas in said chamber at a distance from said sputtering source, comprising a large port in said chamber and a high flow high vacuum pump connected to said port so that the vacuum in said vacuum chamber is at a level of $7 \times 10^{-4}$ Torr or lower, and, substrate positioning means in said vacuum chamber and spaced a substantial distance from said source and said exhausting means whereby said sputtered particles travel a long mean free path from the source to the substrate to coat the same without adverse effect of said inert gas molecules by virtue of the exceedingly low chamber pressure.

13. The apparatus as claimed in claim 12 further including means for directing an ionized reactant gas onto said substrate means to facilitate the coating of said substrate means.

14. The apparatus as claimed in claim 13 wherein said means for directing the reactant gas onto said substrate means comprises an ion gun.

15. The apparatus as claimed in claim 14 further including means for rotating said substrate means within said chamber.

16. The apparatus as claimed in claim 15 further including means for testing the deposition of said coating on said substrate means.

17. The apparatus as claimed in claim 16 wherein said means creating said high density of inert gas comprises a containment means surrounding said source and having one end opening into the vacuum chamber and facing said substrate means.

18. The apparatus as claimed in claim 17 wherein said containment means comprises a ground shield.

19. The apparatus as claimed in claim 18 wherein said containment means includes means for forming a high pressure enclosure as compared to the pressure in the remainder of said vacuum chamber.

20. The apparatus as claimed in claim 19 wherein said containment means includes means for directing said inert gas across the surface of said source.

21. The apparatus as claimed in claim 20 wherein said containment means is relatively small in comparison to the size of said vacuum chamber.

22. The apparatus as claimed in claim 17 wherein said means creating said high density of inert gas comprises a jet gun.

23. The apparatus of claim 12 wherein said substrate positioning means is at least eight inches from said source.

* * * * *